(12) United States Patent
Eto et al.

(10) Patent No.: US 12,706,286 B2
(45) Date of Patent: Aug. 11, 2026

(54) PLASMA PROCESSING METHOD AND PLASMA PROCESSING APPARATUS

(71) Applicant: HITACHI HIGH-TECH CORPORATION, Tokyo (JP)

(72) Inventors: Soichiro Eto, Tokyo (JP); Shigeru Nakamoto, Tokyo (JP); Kosuke Fukuchi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 362 days.

(21) Appl. No.: 18/026,418

(22) PCT Filed: Mar. 4, 2022

(86) PCT No.: PCT/JP2022/009430
§ 371 (c)(1),
(2) Date: Mar. 15, 2023

(87) PCT Pub. No.: WO2023/166712
PCT Pub. Date: Sep. 7, 2023

(65) Prior Publication Data

US 2024/0297027 A1 Sep. 5, 2024

(51) Int. Cl.

| | |
|---|---|
| ***H01J 37/32*** | (2006.01) |
| ***H10P 50/24*** | (2026.01) |
| ***H10P 74/00*** | (2026.01) |

(52) U.S. Cl.
CPC .. *H01J 37/32963* (2013.01); *H01J 37/32926* (2013.01); *H01J 37/32972* (2013.01);
(Continued)

(58) Field of Classification Search
CPC .......... H01J 37/32963; H01J 37/32926; H01J 37/32972; H01J 2237/3346; H01L 21/3065; H01L 22/26; H10P 50/242; H10P 74/238
(Continued)

(56) References Cited

U.S. PATENT DOCUMENTS 4,675,072 A 6/1987 Bennett et al.
5,195,045 A 3/1993 Keane et al.
(Continued)

FOREIGN PATENT DOCUMENTS

CN 114080662 A 2/2022
JP H05-255850 A 10/1993
(Continued)

OTHER PUBLICATIONS

Search Report mailed May 17, 2022 in International Application No. PCT/JP2022/009430.
(Continued)

*Primary Examiner* — Anita K Alanko
(74) *Attorney, Agent, or Firm* — Miles & Stockbridge, P.C.

(57) ABSTRACT

A plasma processing method apparatus for accurately estimating the amount of lateral etching and determining an end point based on the estimated amount of etching, including: a first step of irradiating the wafer with light; a second step of receiving light reflected from the wafer at a plurality of predetermined times during the plasma process on the wafer; a third step of performing signal processing on light amount data on each of a plurality of wavelengths of the light thus received; a fourth step of determining the amount of etching in the wafer during the plasma process by use of processed
(Continued)

data subjected to the signal processing; and a fifth step of determining an end point of the plasma process based on the amount of etching.

9 Claims, 9 Drawing Sheets

(52) U.S. Cl.
CPC .......... *H10P 50/242* (2026.01); *H10P 74/238* (2026.01); *H01J 2237/3346* (2013.01)

(58) Field of Classification Search
USPC .......................................... 156/345.1–345.55
See application file for complete search history.

(56) References Cited

U.S. PATENT DOCUMENTS 5,410,411 A 4/1995 Uchida et al.
5,712,592 A 1/1998 Stimson et al.
5,770,922 A 6/1998 Gerrish et al.
6,153,115 A 11/2000 Le et al.
6,160,621 A 12/2000 Perry et al.
6,265,831 B1 7/2001 Howald et al.
6,270,618 B1 8/2001 Nakano et al.
6,351,683 B1 2/2002 Johnson et al.
6,449,038 B1 9/2002 Stolze
6,490,497 B1 12/2002 Mitsuhashi et al.
RE38,273 E 10/2003 Gerrish et al.
6,677,711 B2 1/2004 MacGearailt
6,746,616 B1 6/2004 Fulford et al.
6,824,813 B1 11/2004 Lill et al.
6,919,689 B2 7/2005 Jafarian-Tehrani et al.
RE39,145 E 6/2006 Perry et al.
7,084,832 B2 8/2006 Pribyl
7,190,119 B2 3/2007 Patrick et al.
7,645,357 B2 1/2010 Paterson et al.
8,038,896 B2 10/2011 Ikegami et al.
8,546,266 B2 10/2013 Mori et al.
9,431,268 B2 8/2016 Lill et al.
9,548,228 B2 1/2017 Chandrashekar et al.
9,978,610 B2 5/2018 Fung et al.
11,875,978 B2 1/2024 Okamoto et al.
2001/0022293 A1 9/2001 Maeda et al.
2002/0115276 A1 8/2002 Yoshida et al.
2003/0043383 A1 3/2003 Usui et al.
2003/0211738 A1 11/2003 Nagata
2004/0004724 A1 1/2004 Kim et al.
2004/0185670 A1 9/2004 Hamelin et al.
2005/0054123 A1 3/2005 Yamashita et al.
2006/0037704 A1 2/2006 Iwata et al.
2006/0048892 A1 3/2006 Arase et al.
2006/0287753 A1 12/2006 Plumhoff
2007/0044716 A1 3/2007 Tetsuka et al.
2007/0202613 A1 8/2007 Usui et al.
2008/0128087 A1 6/2008 Hayano et al.
2008/0190893 A1 8/2008 Mori et al.
2008/0216956 A1 9/2008 Nakamoto et al.
2008/0268645 A1 10/2008 Kao et al.
2008/0277062 A1 11/2008 Koshimizu et al.
2009/0023296 A1 1/2009 Nishizuka
2010/0258529 A1 10/2010 Mori et al.
2010/0330805 A1 12/2010 Doan et al.
2011/0136346 A1 6/2011 Geissbuehler et al.
2011/0253672 A1 10/2011 Kamibayashi et al.
2011/0297533 A1 12/2011 Mori et al.
2012/0101621 A1 4/2012 Usui et al.
2013/0228550 A1 9/2013 Mori et al.
2014/0102640 A1 4/2014 Yokogawa et al.
2014/0225503 A1 8/2014 Mori et al.
2014/0288726 A1 9/2014 Miura et al.
2015/0021294 A1 1/2015 Togami et al.
2015/0064914 A1 3/2015 Kong et al.
2015/0072533 A1 3/2015 Muraki et al.
2015/0099366 A1 4/2015 Takeda et al.
2015/0126035 A1 5/2015 Diao et al.
2015/0179464 A1 6/2015 Wang et al.
2015/0221518 A1 8/2015 Terakura et al.
2015/0262829 A1 9/2015 Park et al.
2015/0270148 A1 9/2015 Shinoda et al.
2015/0357210 A1 12/2015 Mori et al.
2016/0005602 A1 1/2016 Yoo et al.
2016/0035585 A1 2/2016 Xiang et al.
2016/0240446 A1* 8/2016 Matsuda .......... H01J 37/32972
2016/0284610 A1 9/2016 Usui et al.
2016/0293441 A1 10/2016 Lee et al.
2017/0103893 A1 4/2017 Kulshreshtha et al.
2017/0178874 A1 6/2017 Kawaguchi et al.
2017/0358504 A1 12/2017 Usui et al.
2018/0068862 A1 3/2018 Terakura et al.
2018/0076048 A1 3/2018 Gohira et al.
2018/0149809 A1 5/2018 Tsuji
2018/0277377 A1 9/2018 Eto et al.
2019/0049937 A1 2/2019 Tetiker et al.
2019/0067032 A1 2/2019 Shinoda et al.
2020/0043744 A1 2/2020 Ito et al.
2021/0225674 A1 7/2021 Eto et al.
2023/0096723 A1* 3/2023 Okamoto ............... H01L 21/67 438/9
2024/0213004 A1* 6/2024 Eto ........................ H01J 37/32

FOREIGN PATENT DOCUMENTS

JP H08-236592 A 9/1996
JP H11-185998 A 7/1999
JP H11-260799 A 9/1999
JP 2000-276221 A 10/2000
JP 2001-085388 A 3/2001
JP 2001-185542 A 7/2001
JP 2002-081917 A 3/2002
JP 2002-343768 A 11/2002
JP 2003-083720 A 3/2003
JP 2003-347278 A 12/2003
JP 2004-507070 A 3/2004
JP 2006-066905 A 3/2006
JP 2007-059567 A 3/2007
JP 2007-073567 A 3/2007
JP 2007-234666 A 9/2007
JP 2008-218898 A 9/2008
JP 2008-244146 A 10/2008
JP 2009-135478 A 6/2009
JP 2010-034582 A 2/2010
JP 2010-129884 A 6/2010
JP 2011-082180 A 4/2011
JP 2011-228436 A 11/2011
JP 2014-007370 A 1/2014
JP 2015-023104 A 2/2015
JP 2016-152313 A 8/2016
JP 2016-184638 A 10/2016
JP 2018-046185 A 3/2018
JP 2018-088455 A 6/2018
JP 2015-144158 A 8/2018
JP 2019-040932 A 3/2019
KR 100263406 B1 11/2000
KR 10-2021-0157394 A 12/2021
TW 200620454 A 6/2006
TW 200802592 A 1/2008
TW 200829087 A 7/2008
TW 201533796 A 9/2015
TW 201546897 A 12/2015
TW 2016037093 A 10/2016
TW 201730962 A 9/2017
TW 201802931 A 1/2018
TW 201824341 7/2018
TW 201841189 A 11/2018
WO 2001023830 A1 4/2001
WO 2017154407 A1 9/2017
WO 2018052494 A1 3/2018
WO 2020031224 A1 2/2020

(56) References Cited

FOREIGN PATENT DOCUMENTS

| | | | | |
|---|---|---|---|---|
| WO | 2020161887 A1 | | 8/2020 | |
| WO | WO 2021 255812 A1 | * | 12/2021 | ......... H01L 21/3065 |

OTHER PUBLICATIONS

Written Opinion mailed May 17, 2022 in International Application No. PCT/JP2022/009430.
Notice of Allowance mailed Sep. 22, 2021 in U.S. Appl. No. 16/646,790.
Office Action mailed Nov. 3, 2016 in U.S. Appl. No. 14/852,189.
Notice of Allowance mailed Apr. 13, 2017 in U.S. Appl. No. 14/852,189.
Office Action mailed May 21, 2018 in U.S. Appl. No. 15/673,151.
Search Report mailed Mar. 12, 2019 in International Application No. PCT/JP2019/004629.
Office Action mailed Feb. 19, 2025 in Korean Application No. 10-2023-7008866.
Office Action mailed Jan. 21, 2025 in Japanese Application No. 2024-005163.
Office Action mailed Nov. 2, 2021 in U.S. Appl. No. 16/527,520.
Office Action mailed Mar. 30, 2023 in Korean Application No. 10-2021-7026679.
Office Action mailed Dec. 6, 2021 in Taiwanese Application No. 110121684.
Search Report mailed Jul. 14, 2020 in International Application No. PCT/JP2020/023526.
Patrick Verdonck et al.; "Analysis of the Etching Mechanisms of Tungsten in Fluorine Containing Plasmas"; Journal of Electrochemical Society; vol. 142, No. 6, pp. 1971-1976, (Jun. 1995).
Office Action mailed Sep. 26, 2018 in Taiwanese Application No. 107106284.
Office Action mailed Jul. 13, 2018 in Korean Application No. 10-2014-0013325.
Office Action mailed Jul. 13, 2018 in Korean Application No. 10-2015-0053111.
Office Action mailed Aug. 9, 2016 in Japanese Application No. 2013-112562.
Office Action mailed Jan. 15, 2016 in Taiwanese Application No. 104123764.
Office Action mailed Jan. 19, 2015 in Korean Application No. 10-2014-0013325.
STIC Search Report mailed Oct. 7, 2014 in U.S. Appl. No. 14/177,251.
Office Action mailed Jun. 9, 2020 in Japanese Application No. 2019-110321.
Office Action mailed Mar. 11, 2020 in Taiwanese Application No. 108125932.
Office Action mailed Aug. 27, 2018 in Korean Application No. 10-2017-7020315.
Office Action mailed Aug. 30, 2018 in Korean Application No. 10-2018-7015807.
Notice of Allowance mailed Sep. 1, 2023 in U.S. Appl. No. 17/439,318.
Office Action mailed Jun. 30, 2026 in Chinese Application No. 202280006434.5.

* cited by examiner

PLASMA PROCESSING METHOD AND PLASMA PROCESSING APPARATUS

TECHNICAL FIELD

The present invention relates to a plasma processing method and a plasma processing apparatus for processing a substrate-shaped sample such as a semiconductor wafer placed in a process chamber inside a vacuum chamber by use of plasma formed inside the process chamber. Particularly, the present invention relates to a plasma processing method and a plasma processing apparatus for performing processing while an amount related to processing on a wafer is detected by use of light from inside a process chamber.

BACKGROUND ART

In the manufacture of semiconductor devices, a step of forming components as a set of circuits yielding various functions or wiring lines connecting the components to each other on the surface of a semiconductor wafer is performed. The formation of the components or the wiring lines is performed by repeating process steps such as formation of film layers made of various materials, including a conductor, a semiconductor, or an insulator formed in advance, on the surface of a substrate-shaped sample such as a semiconductor wafer, and removal of an unnecessary part of the film layers. In such a step of removal of an unnecessary part, a dry-etching process using plasma is used widely.

In the etching (plasma etching) using plasma, gas for the process is introduced into a process chamber provided inside a vacuum chamber of a processing apparatus, and a high-frequency electric field caused by high frequency power supplied from a high frequency source is supplied into the process chamber. Atoms or molecules of the gas thus introduced are excited to be ionized or dissociated such that the gas is plasmatized, and the surface of a sample provided in the process chamber is exposed to the plasma to be brought into contact with the plasma, so that a reaction occurs between particles in the plasma and a film layer as a process target. At this time, anisotropic or isotropic etching is performed on the film layer as the process target by a physical reaction such as sputtering by charged particles such as ions in the plasma or a chemical reaction by radicals (particles or active species having a reaction activity). Processes having different characteristics are selected appropriately and applied to a wafer surface, so that components or wiring lines having circuit structures yielding the various functions are formed.

In a case where a processed shape by the plasma etching is different from a design, various components to be formed cannot achieve their functions. On that account, a lot of process monitoring technologies to monitor and stabilize the etching process have been proposed. A process monitor for measuring the film thickness of a film deposited on a wafer in process or the depth of a groove or a hole formed on the wafer by measuring reflection light from the wafer is called a thickness-depth monitor and has been used for end-point determination of the etching process, or the like.

Patent Document 1 describes a method for improving machining accuracy by use of the thickness-depth monitor. In this method, the timing just before a film as a process target is removed completely is detected by use of the thickness-depth monitor using plasma light as a light source, and the etching process is ended.

Patent Document 2 describes a technology to improve the accuracy of measurement of a film thickness or a depth by the thickness-depth monitor. In this method, an external light source is used as a light source to irradiate a wafer with light, instead of the plasma light. This reduces fluctuations in the light amount of the light source and achieves highly accurate thickness-depth measurement.

CITATION LIST

Patent Documents

Patent Document 1: Japanese Patent Application Laid-Open No. 11-260799

Patent Document 2: Japanese Patent Application Laid-Open (Translation of PCT Application) No. 2004-507070

SUMMARY OF THE INVENTION

Problem to be Solved by the Invention

Some semiconductor devices that are three-dimensionalized may include a process of selectively performing lateral etching on one of films in a multilayer film (a laminated structure) including films of two or more types that are laminated on one another. For example, a step of forming a gate electrode in a next-generation 3D-NAND flash memory includes a process of etching a tungsten film in its lateral direction (a horizontal direction relative to a vertical depth direction of a groove) from a minute groove with a high-aspect-ratio, formed in a laminated structure including a metal film and an insulating film.

In the related art, in the lateral etching, the amount of etching is controlled based on time for etching. The amount of etching can be measured based on the difference in the weights of a wafer before and after etching. However, in this method, it is difficult to strictly control the amount of lateral etching on the metal film, and therefore, a technology to determine the end point of etching by monitoring the amount of lateral etching is required.

As a method of monitoring the amount of etching, such a method is conceivable that, similarly to Patent Document 1, a spectrum of reflection light from a wafer is measured during etching, the measured spectrum is compared with a database (DB) in which spectra prepared in advance as a reference are associated with their corresponding amounts of etching, and hereby, the amount of lateral etching is calculated during the etching. In this method, it is necessary that the relationship between the amount of etching and the spectrum be always uniform. Here, in the 3D-NAND, the number of laminations of metal films or insulating films is from several dozens to several hundreds, and therefore, when the film thickness of the insulating films changes by 1 nm due to deposition variation, for example, the height of whole laminated films largely changes by 100 nm in a case where the number of the insulating films is 100. In a case where the spectrum of reflection light from a wafer in which only insulating films are formed is detected, it is known that peak positions or the number of peaks in the spectrum largely changes depending on the difference in the thickness of the insulating films. In a case where the height of the whole laminated films changes as such, even when a spectrum caused due to lateral etching on the metal films is obtained, a variation in the spectrum, caused due to the difference in the height of the whole laminated films, is included as a noise, thereby resulting in that the correspondence between the measured spectrum and the amount of etching does not agree with the spectrum and the amount of etching in reference data. Accordingly, in a case where the height of the whole laminated films changes, it is difficult to determine the end point of etching by estimating the amount of lateral etching by use of the spectrum of reflection light from the wafer. Patent Document 1 or Patent Document 2 do not disclose any awareness of the problem about such a variation in the spectrum that is caused due to the difference in the height of the whole laminated films.

The present invention is to solve the above problem and to provide a plasma processing method and a plasma processing apparatus each for accurately estimating the amount of lateral etching and determining an end point based on the estimated amount of etching.

Means for Solving the Problems

In order to solve the problem, a representative plasma processing method of the present invention is a plasma processing method for performing a plasma process on a wafer and includes: a first step of irradiating the wafer with light; a second step of receiving light reflected from the wafer at a plurality of predetermined times during the plasma process on the wafer; a third step of performing signal processing on light amount data on each of a plurality of wavelengths of the light thus received; a fourth step of determining the amount of etching in the wafer during the plasma process by use of processed data subjected to the signal processing; and a fifth step of determining an end point of the plasma process based on the amount of etching.

Advantageous Effect of the Invention

With the present invention, it is possible to accurately estimate the amount of lateral etching and determine an end point based on the estimated amount of etching. Problems, configurations, and effects other than those described above will be made clear by the following descriptions of embodiments.

MODES FOR CARRYING OUT THE INVENTION

With reference to drawings, the following describes an embodiment of the present invention. Note that the present invention is not limited by this embodiment. Further, in the following description, the same element has the same reference sign.

In this disclosure, an "upper side" indicates an upper direction along the vertical direction of a substrate surface of an Si substrate put on a specimen support, and a "lower side" indicates a lower direction along the vertical direction. Further, a "lateral direction" indicates a direction horizontal from the substrate surface.

Further, "light amount data" or "light amount" includes not only direct data on a light amount (intensity of light) such as the reflectance of reflection light from a wafer, but also data related to a change amount of the direct data such as a difference in the reflectance.

First Embodiment

Figures 1A, 1B:
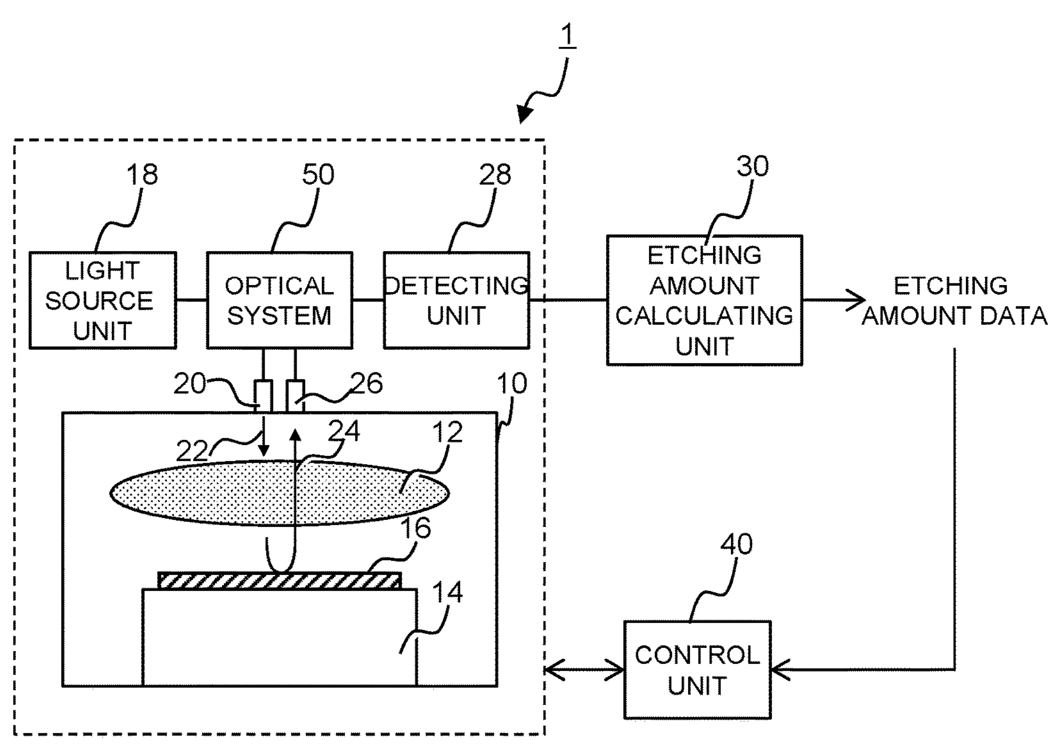
FIGS. 1A and 1B are views schematically illustrating a configuration of a plasma processing apparatus according to a first embodiment.
Figure 2:
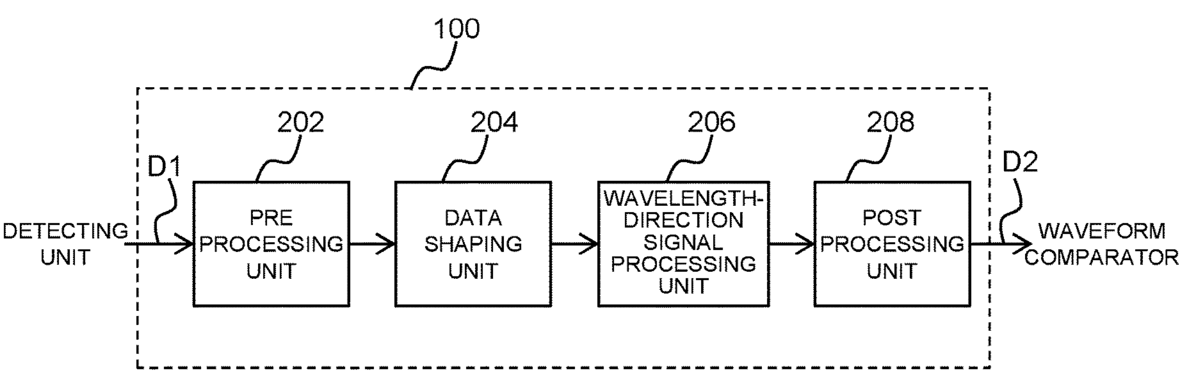
FIG. 2 is a view illustrating a configuration of functional blocks of a digital signal processing unit.

Referring now to FIGS. 1A and 2, a plasma processing method and a plasma processing apparatus according to a first embodiment of the present invention will be described.

FIGS. 1A and 1B are views schematically illustrating a configuration of the plasma processing apparatus according to the first embodiment. The plasma processing apparatus 1 illustrated in FIG. 1A includes a vacuum process chamber 10, a light source unit 18, an optical system 50, a detecting unit 28, an etching amount calculating unit 30, and a control unit 40.

The vacuum process chamber 10 generates plasma 12 by exciting and decomposing etching gas introduced into the vacuum process chamber 10 from gas introduction means (not illustrated), by electric power or microwaves generated by use of a high frequency source or the like (not illustrated). Due to the plasma 12, a process target 16 such as a semiconductor wafer provided on a specimen support 14 is subjected to an etching process (a plasma process). The control unit 40 performs the introduction of the gas into the vacuum process chamber 10, the generation and the control of the plasma 12, the application of a voltage to the process target 16, performed by the high frequency source or the like, and so on and adjusts synchronization between devices and timing so that a desired etching process is achieved. In a case where the plasma 12 is pulsed, the control unit 40 also controls the pulsing. At this time, the plasma 12 is pulsed by modulating ON and OFF of the application of the voltage, the application of the microwaves, and so on performed by the high frequency source or the like to plasmatize the etching gas. Further, the plasma is also pulsed by performing time modulation on the introduction of the etching gas.

The plasma processing apparatus 1 includes a mechanism of measuring the film thickness or the depth of the process target 16. Light emitted from the light source unit 18 is introduced into the vacuum process chamber 10 through the optical system 50 and an introduction lens 20, and irradiation light 22 is applied to the process target 16. The light source unit 18 can use continuous light from ultraviolet to infrared, but the light source unit 18 can also perform thickness-depth measurement by use of a specific wavelength. Reflection light 24 from the process target 16 is introduced into the detecting unit 28 through a detection lens 26 for detection and the optical system 50.

The detecting unit 28 has a configuration using a spectroscope, for example, and disperses introduced light and detects the light amount at each wavelength. In a case where the thickness-depth measurement is performed by use of a specific wavelength, a photodetector or the like may be used in the detecting unit, instead of the spectroscope. At this time, in a case where the light introduced into the detecting unit 28 is light at only a desired specific wavelength, the photodetector should be used directly, but in a case where continuous light is introduced, a mechanism for selecting only the specific wavelength by a monochromator or the like should be provided at a stage before the photodetector.

Here, in FIG. 1A, the introduction lens 20 configured to introduce light into the vacuum process chamber 10 and the detection lens 26 configured to detect reflection light are provided such that their positions do not overlap with each other. In a case of this configuration, in order to detect the reflection light 24 most efficiently, it is desirable that the introduction lens 20 and the detection lens 26 be provided to be inclined such that the introduction lens 20 and the detection lens 26 face each other on the same optical path constituted by the irradiation light 22 and the reflection light 24 with the process target 16 being taken as a reflection surface.

The configurations of the introduction lens 20 and the detection lens 26 are not limited to those in FIG. 1A, and the introduction lens 20 and the detection lens 26 may be constituted by a single common lens as a completely coaxial configuration. In this case, it is desirable that the light direction of the lens be perpendicular to the process target 16 so that vertical reflection light obtained as a result of vertical irradiation is detectable. Further, in FIG. 1A, a pair of an introduction system for the irradiation light 22 and a detection system for the reflection light 24 is described, but in a case where the thickness-depth measurement is performed at a plurality of positions on the process target 16, a plurality of measurement systems should be provided.

In FIG. 1A, a case where light is incident from the light source unit 18 provided externally as a light source has been described, but in a case where light of the plasma 12 is used as a light source, the light source unit 18 may not be used. In a case where the plasma 12 is used as a light source, light emitted from the plasma 12 is reflected by the process target 16, and the reflection light 24 is detected in a similar manner to the case where the light source unit 18 is used. Data from the detecting unit 28 is introduced into the etching amount calculating unit 30, and the film thickness or the depth is determined.

Here, FIG. 1B is a view illustrating a configuration of the etching amount calculating unit 30. Specifically, FIG. 1B is a block diagram in which the configuration of the etching amount calculating unit 30 illustrated in FIG. 1A is divided into units yielding respective functions as blocks, and exchanges or flows of data or information between the units are indicated by lines or arrows.

Time series data D1 on the light amount at each wavelength is output from the detecting unit 28 and introduced into the etching amount calculating unit 30, various noises or fluctuations in the time series data D1 are removed or corrected by a digital signal processing unit 100, and resultant data is supplied to a waveform comparator 102 as time series data D2.

In the first embodiment, the time series data D2 output from the digital signal processing unit 100 is received by the waveform comparator 102, and the waveform comparator 102 compares, by use of a calculator, the time series data D2 with at least one pattern data indicative of the correlation between the amount of etching and the light amount at each wavelength, the at least one pattern data being data acquired in advance and stored in a waveform pattern database 122. The waveform comparator 102 compares pieces of pattern data stored in the waveform pattern database 122 with data D2(*i*) at each sampling time i in the time series data D2, the pieces of pattern data being obtained by associating a plurality of values of the amount of etching or the time after the start of processing with values of the light intensity at a plurality of wavelengths and taking the wavelengths as a parameter, so that data with the smallest difference from the data D2(*i*), among the pieces of pattern data each on the light amounts (light intensity) at the plurality of wavelengths for each amount of etching or each time after the start of processing, is detected as nearest pattern data. Thus, pattern matching is performed by detecting pattern data nearest to data.

As the pattern data with the smallest difference, data with a smallest standard deviation between pieces of data on a plurality of wavelengths can be used, for example. The amount of etching corresponding to the nearest pattern data is calculated as the amount of etching at the sampling time i. The amount of etching at each sampling time i, calculated in the waveform comparator 102, is transmitted to an etching amount storage unit 104, output as time series data D3(*i*), and then stored in a storage device such as a hard disk, a RAM made of semiconductor, or a ROM connected to the etching amount storage unit 104 in such a manner that data is communicable.

Light amount data on each wavelength in the waveform pattern database 122 is data processed by signal processing performed by the digital signal processing unit 100, and it is desirable that the signal processing be the same as the signal processing performed on the time series data D2, but the signal processing may be different from the signal processing performed on the time series data D2. Here, in a case where the waveform pattern database 122 includes a plurality of databases each for pattern data on the amount of etching and the light amount at each wavelength, a thickness-depth D3 determined by use of each database may be supplied to the etching amount storage unit 104.

The etching amount storage unit 104 outputs time series data D4 on the amount of etching to an etching amount correcting unit 106.

The etching amount correcting unit 106 can correct the amount of etching at each time based on a time-series transition of the calculated amount of etching. For example, in a case where the time-series transition of the calculated amount of etching has fluctuations caused due to noise or the like, the transition of the amount of etching with time is linearly approximated to correct the amount of etching at each time. The amount of etching corrected by the etching amount correcting unit 106 is output externally as etching amount data.

FIG. 2 is a view illustrating a configuration of functional blocks of the digital signal processing unit 100. In the digital signal processing unit 100, a spectrum input from the detecting unit 28 into the digital signal processing unit 100 is subjected to signal processing for the purpose of noise or offset removal or correction of fluctuations in the light amount in a preprocessing unit 202. For example, a lowpass filter is used for noise removal in the time axis at each wavelength. As the lowpass filter, a second-order Butterworth lowpass filter can be used, for example, and the time series data D2 is found by the following formula.

$$D2(i) = b1 \cdot D1(i) + b2 \cdot D1(i-1) + b3 \cdot D1(i-2) - \{a2 \cdot D2(i-1) + a3 \cdot D2(i-2)\} \quad \text{[Math 1]}$$

Here, Dk(i) indicates data at time i for each data Dk, and coefficients b, a have values varying in accordance with a sampling frequency and a cut-off frequency. Further, a coefficient value of a digital filter is, for example, a2=−1.143, a3=0.4128, b1=0.067455, b2=−0.013491, b3=0.067455 (a sampling frequency of 10 Hz, a cut-off frequency of 1 Hz). In a case where a light-amount offset at each wavelength is removed and changes in the light amount with time is observed, signal processing of calculating a light-amount change amount and a differential value between times should be used. For example, with the use of the S-G (Savitzky-Golay) method along the time axis, time series data to be output becomes a differential value. This differential value is a polynomial-fitting smoothing differentiation method and is given by the following formula.

$$D3(i)=\sum_{j=-2}^{j=2} Wj\cdot D2(i+j) \qquad \text{[Math 2]}$$

Here, in terms of a weighting factor wj, in first-order differential calculation, w−2=−2, w−1=−1, w0=0, w1=1, w2=2 are used, for example. Further, in second-order differential calculation, w−2=2, w−1=−1, w0=−2, w1=−1, w2=2 are used, for example.

Further, in terms of data Dk(i) at any of sampling times, in a case where the values of light amounts at all target wavelengths to be detected in the data change with time at the same rate, a process of standardizing the values of the light amount at each wavelength by the average value or the sum of absolute values of the light amounts at all wavelengths can be applied.

A signal output from the preprocessing unit 202 is subjected to shaping of the number of pieces of data in the wavelength direction in a data shaping unit 204. For example, in a case where a wavelength-direction signal processing unit 206 (described later) performs digital signal processing based on a wavenumber axis (inverse of the wavelength), spectrum data is resampled such that wavelengths in the spectrum at each time are converted into wavenumbers, and the wavenumbers are arranged at equal intervals along the wavenumber axis. Spline interpolation is used for resampling, for example. Further, for example, in a case where the wavelength-direction signal processing unit 206 performs digital signal processing based on a wavelength axis, spectrum data is resampled from the spectrum at each time such that wavelengths are arranged at equal intervals along the wavelength axis.

A signal output from the data shaping unit 204 is subjected to signal processing in the wavelength direction in the wavelength-direction signal processing unit 206. For example, in a case where vibration components in the light amount in the wavelength direction is removed, an LPF is performed along the wavelength axis. The LPF may be performed along the wavelength axis as such, but in a case where vibrations in the light amount along the wavelength axis or the wavenumber axis occur due to optical interference, the light amount vibrates at close frequencies in terms of the wavenumber axis, and therefore, the execution of the LPF on the wavenumber axis may be more effective to remove the vibrations.

Further, for example, for the purpose of detecting an envelope of the vibration components in the light amount in the wavelength direction, Hilbert transform or peak or bottom detection is performed on the wavelength axis or the wavenumber axis. In the Hilbert transform, in a case where the light amount vibrates at close frequencies in terms of the wavenumber axis, it is desirable to perform signal processing on the wavenumber axis rather than the wavelength axis, similarly to the above description. In the meantime, in a case of envelope detection by the peak or bottom detection, it is not necessary that data have equal intervals on the wavelength axis or the wavenumber axis, and therefore, either of the wavelength axis and the wavenumber axis may be used.

A signal output from the wavelength-direction signal processing unit 206 is supplied to a postprocessing unit 208. In a case where there is signal processing such as the LPF for the purpose of removal of noise in the time direction in the input signal or noise removal that has not be performed in the preprocessing unit 202, the postprocessing unit 208 performs those processes. Further, spectra at respective times are separately subjected to signal processing in the wavelength-direction signal processing unit 206, and therefore, a smoothing process is performed on the spectra at respective times to secure time continuity between the spectra. A signal D2 subjected to the signal processing is output from the digital signal processing unit 100 and input into the waveform comparator 102.

The plasma processing apparatus illustrated in FIG. 1A performs end-point determination by use of a signal indicative of the amount of etching, output from the etching amount calculating unit 30. That is, an end-point determination device receiving the signal from the etching amount calculating unit 30 compares the amount of etching, indicated by the signal, with a predetermined target amount of etching, and in a case where the end-point determination device determines that the amount of etching is within a predetermined allowable range, it is determined that the process has arrived at its end point, but in a case where the amount of etching is out of the allowable range, it is determined that the process has not arrived at the end point yet. In a case where it is determined that the amount of etching has arrived at the target amount of etching, the arrival is notified by an alarm device such as a monitor, a lamp, a signal sender, or the like (not illustrated), and the control unit 40 receiving a signal indicative of the arrival sends, to the plasma processing apparatus, a signal to stop the etching process or to change the condition of the process.

The plasma processing apparatus 1 stops the etching process on a target film layer of the process target 16 from which etching is detected, based on a received etching stop signal, or the plasma processing apparatus 1 changes the condition of the process and performs steps of a subsequent process on the process target 16. With this operation, the plasma processing apparatus 1 can perform end-point determination operation using etching-amount monitoring.

Figure 3A:
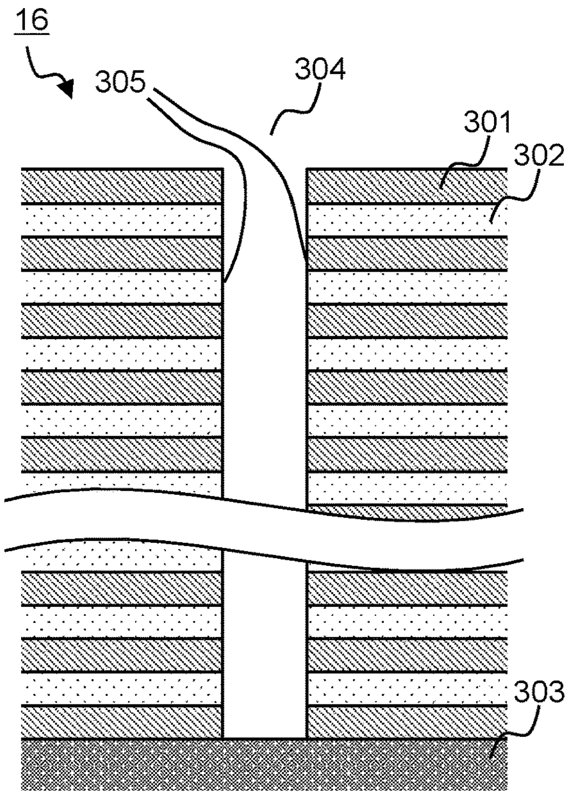
FIGS. 3A and 3B are vertical sectional views schematically illustrating a film structure of a process target.
Figure 3B:
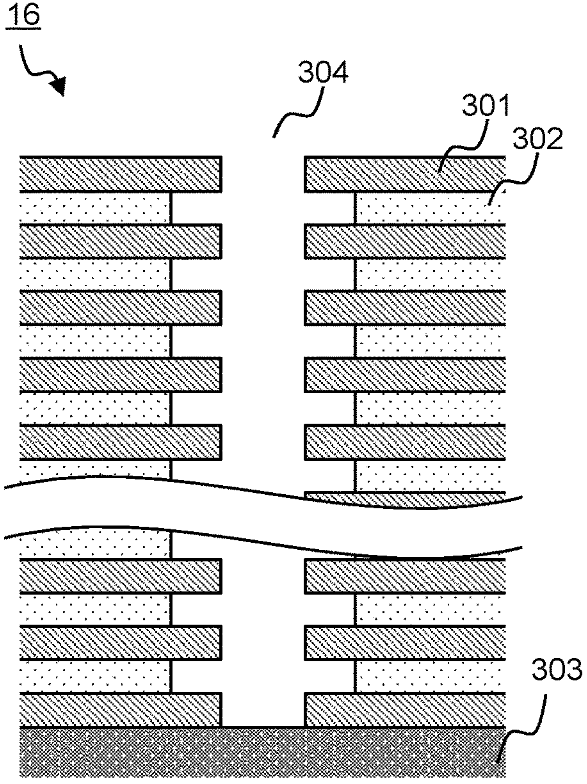

Referring now to FIGS. 3A and 3B, the following describes a film structure as a target on which, by use of the plasma processing apparatus according to the first embodiment, the etching process is performed while the amount of etching is detected. FIGS. 3A and 3B are vertical sectional views schematically illustrating a film structure of a process target.

In the film structure of the process target 16, a plurality of oxide films 301 and a plurality of metal films 302 are alternately laminated on an Si substrate 303 in the up-down direction. As illustrated in FIGS. 3A and 3B, the film structure includes a trench 304 formed in central parts of the films in the vertical direction (the up-down direction) and having a groove-shaped or hole-shaped structure, and the films have side wall surfaces 305 facing the inside of the trench 304.

In the plasma processing apparatus 1 of the first embodiment, in an etching step performed on the process target 16, the metal films 302 in the film structure are selectively etched in the lateral direction from the front surfaces of the side wall surfaces 305 facing the trench 304. Here, FIG. 3A illustrates a state before the start of the etching step. Since the etching has not been performed yet, the positions of end portions of the metal films 302, facing the trench 304 are the same as the positions of end portions of the oxide films 301 upwardly or downwardly adjacent to the metal films 302. In the meantime, FIG. 3B illustrates a state where the etching step is started and advanced. Respective parts of the metal films 302, facing the trench 304, are removed, and lateral recesses from the end portions of the oxide films 301 are formed in the trench 304.

Thus, in the etching step of the first embodiment, the metal films 302 are removed and recessed (dented) only by a desired amount in the film structure having multiple layers in which the oxide films 301 and the metal films 302 are laminated in the up-down direction, based on the side wall surface 305 before the etching step. Here, in the first embodiment, the oxide films 301 and the metal films 302 have respective film thicknesses of 25 nm, and the number of the metal films 302 to be laminated is 100. Because of this, the multilayer film has a very thick structure the whole height of which is equal to or more than 5 μm. The trench 304 has a width of 200 nm, and the trench 304 is formed on the Si substrate 303 at a pitch of 1 μm.

Figure 4A:
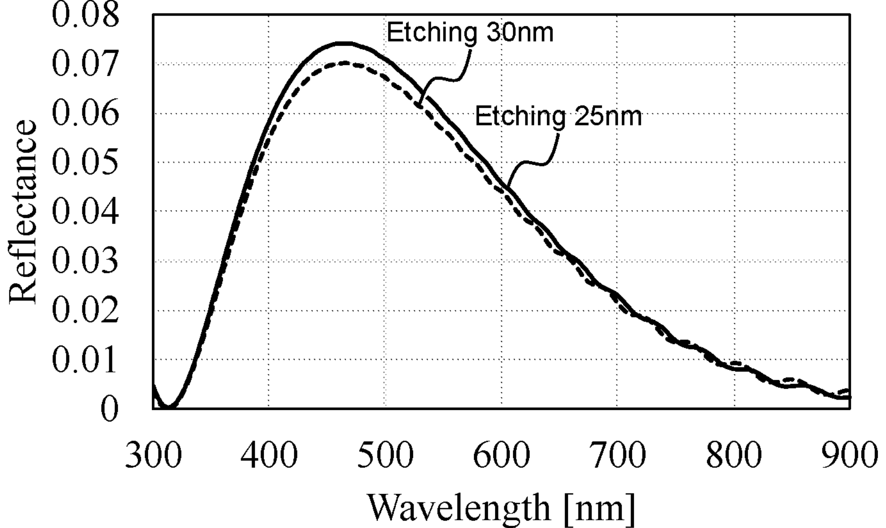
FIGS. 4A and 4B are views illustrating the light amount of light obtained during an etching process on the process target.
Figure 5:
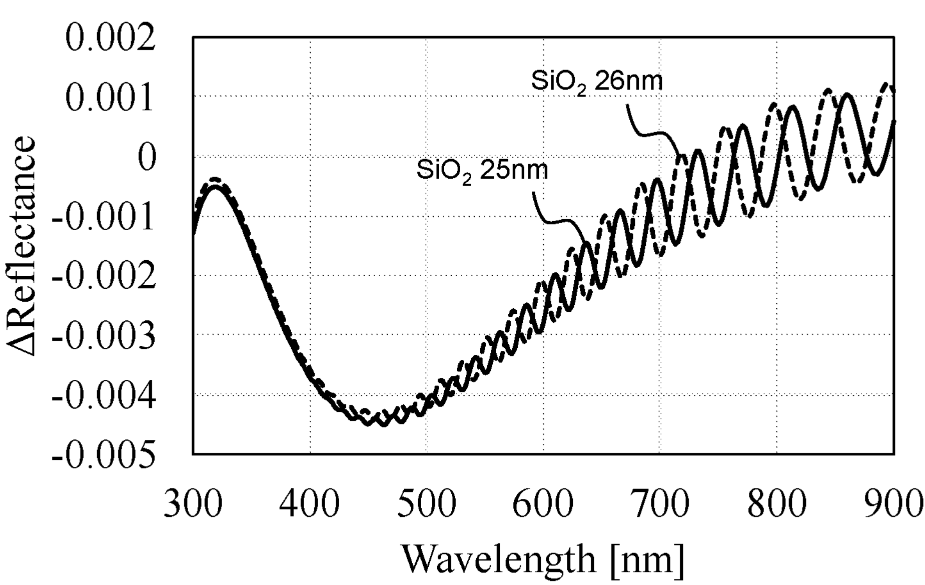
FIG. 5 is a view illustrating spectra in a case where the film thickness of $SiO_2$ varies.

Referring now to FIGS. 4A and 5, the following describes the influence of the film thickness on the amount of etching.

Figure 4B:
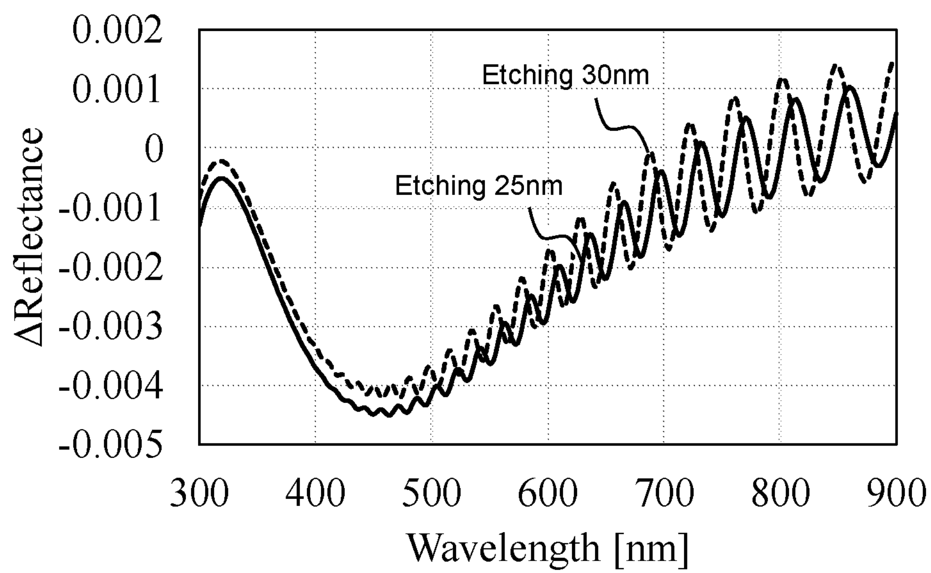

An example of spectra detected from light obtained from the surface of the process target 16 placed in the vacuum process chamber 10 of the plasma processing apparatus 1 of the present embodiment is illustrated in FIGS. 4A and 4B. FIGS. 4A and 4B are views illustrating the light amount of light obtained during the etching process on the process target.

Here, FIG. 4A illustrates respective pieces of light amount data on the reflection light 24 from the surface of the process target 16 in respective cases where the amount of etching from the start of the process on the metal film 302 are 25 nm and 30 nm, and the respective pieces of light amount data are each illustrated as a reflectance spectrum on a plurality of wavelengths. The respective pieces of light amount data correspond to the data D1. Here, the amount of etching in the metal film 302 is indicated as the value of the depth of a lateral recess of the metal film 302 from an edge of the oxide film 301, facing the trench 304, that is, the position of the end portion of the metal film 302, facing the trench 304, before the start of the etching step is considered to be zero as a reference, and a lateral direction where the etching advances is taken as a positive side. As illustrated in FIG. 4A, it can be found that the spectrum changes as the etching advances.

The reflectance spectrum illustrated in FIG. 4A appears to change smoothly as the wavelength changes, but it is actually found from this figure that the spectrum acquired during the etching on the laminated film structure vibrates in a wavelength-axis direction. This is because the film structure of a semiconductor wafer has a repetition structure of the oxide film and a vacuum part where the metal film is removed or a region, like a trench groove, where light can pass to the Si substrate 303, and the height of the repetition structure or the region is several micrometers and very large.

When light passing by several micrometers and reflected from the Si substrate 303 interferes with light reflected from the surface of an uppermost oxide film, the optical length difference between them varies depending on the wavelength. The variation in the optical length difference depending on the wavelength becomes larger in proportion to the height of a lamination part where the oxide films and the vacuums are laminated or the height of the trench, and therefore, in this film structure, strengthening and weakening of the interference in the wavelength direction are repeatedly observed, thereby resulting in that vibrations in the light amount (intensity) in the wavelength direction are observed.

As the etching advances, the reflectance spectrum changes. Here, FIG. 4B illustrates a result obtained by calculating light amount data on the reflection light 24 in the form of a spectrum of a reflectance change amount (hereinafter also referred to as "spectrum difference" or "light-amount difference"). The data corresponds to output data from the preprocessing unit 202. A spectrum indicated by a continuous line represents a spectrum difference when the metal film 302 is changed from 20 nm to 25 nm, and a broken line represents a spectrum difference when the metal film 302 is changed from 25 nm to 30 nm. Even from the spectrum difference, a change can be found as the etching advances, and therefore, it is found that, by use of the spectra and the spectrum differences in FIGS. 4A and 4B, the amount of etching in the metal film 302 can be estimated.

Here, the number of laminated films in FIG. 3A is 100, and therefore, in a case where this structure is manufactured, the deposition of the oxide films 301, the metal films 302, or the like varies in terms of the film thickness along the height direction. For example, in a case where the oxide film is increased by 1 nm, the height of the whole laminated films is changed by 100 nm.

FIG. 5 is a view to describe spectra of different $SiO_2$ film thicknesses. FIG. 5 illustrates spectrum differences observed in a case where the $SiO_2$ film thickness is 25 mm and in a case where the $SiO_2$ film thickness is 26 nm due to variation in deposition. A spectrum difference indicated by a continuous line represents a case where the $SiO_2$ film thickness is 25 nm, and a spectrum difference indicated by a broken line represents a case where the $SiO_2$ film thickness is 26 nm. In either of the spectrum differences, the amount of etching of the metal film is 25 nm, and the spectrum differences are spectrum differences at the time when the amount of etching is changed from 20 nm to 25 nm. It is found that, although the amount of etching of the metal film is the same, the spectrum changes when the film thickness of the $SiO_2$ film changes. Accordingly, in a case where the amount of etching is estimated from a spectrum, even when pattern data that is data as a comparison target having the correlation between a specific spectrum and the amount of etching is just registered in the waveform pattern database 122 in FIG. 1B, it is difficult to detect the amount of etching with high accuracy by spectrum pattern matching due to variations in the height of the whole laminated films between wafers.

Figure 6A:
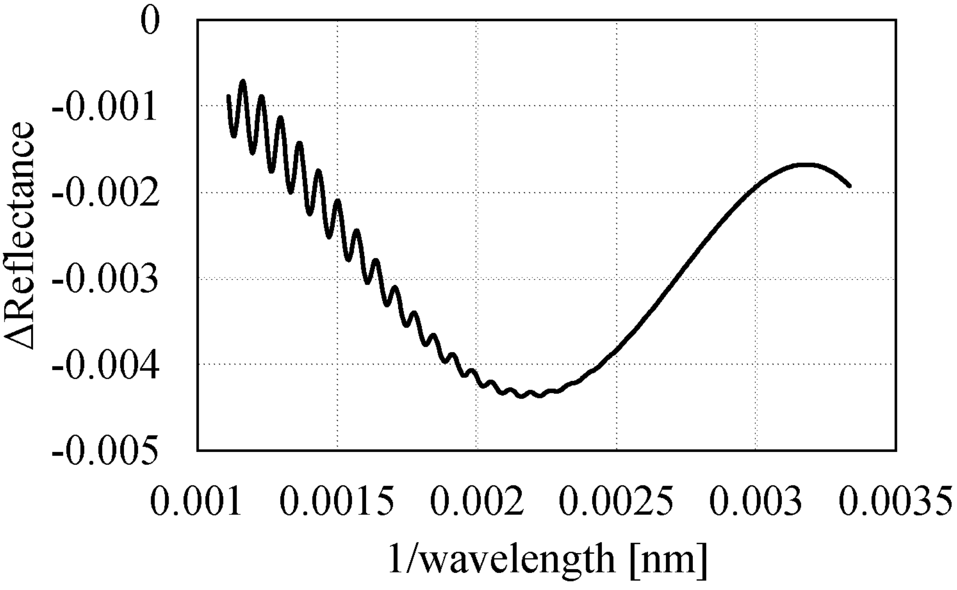
FIGS. 6A and 6B are views illustrating an example of a spectrum obtained by data shaping.
Figure 6B:
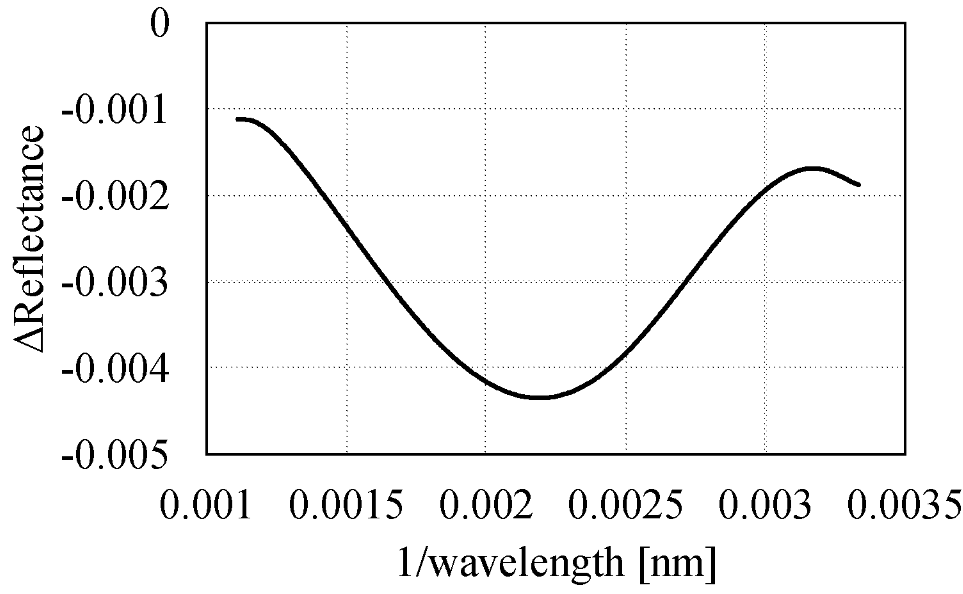
Figure 7:
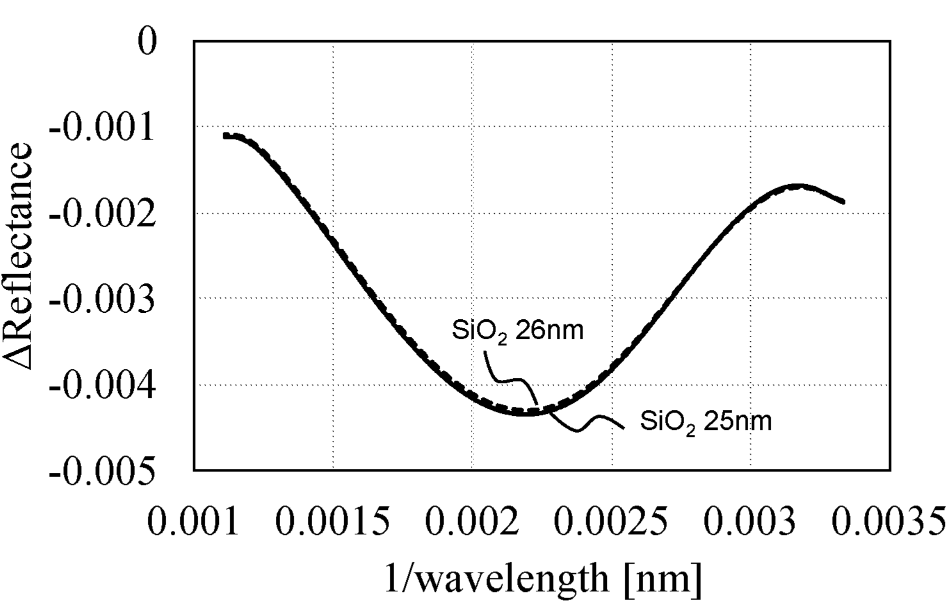
FIG. 7 is a view illustrating a result obtained by comparing processed data subjected to signal processing with pattern data.

Referring now to FIGS. 6A, 6B and 7, the following describes a process of detecting the amount of etching in the film structure of the process target.

In the following description, the amount of etching is detected by the etching amount calculating unit 30. Further, a wafer is etched, and the amount of etching in a metal film of the wafer is estimated. Further, the $SiO_2$ film thickness in a film structure formed on the surface of the process target 16 is 25 nm.

The light amount data processed by the preprocessing unit 202 is transmitted to the data shaping unit 204, and signal processing is performed on the light amount data as needed, so that resampling of spectrum data at each time is performed. In the present embodiment, in the spectrum at each sampling time, the wavelength axis is converted to the wavenumber, and resampling is performed by use of Spline interpolation to divide the wavenumber from 1/300 nm to 1/900 nm (the denominator is a wavelength) on the wavenumber axis into 512 points at equal intervals, so that spectrum data created by data shaping is obtained.

FIGS. 6A and 6B are views illustrating an example of the spectrum created by data shaping. Hereby, FIG. 6A illustrates an example of a spectrum difference obtained by converting the lateral axis into the wavenumber by the data shaping unit 204. The lateral axis indicates the wavenumber, the vertical axis indicates the difference in reflectance, derived based on light-amount differences, and the spectrum difference represents a spectrum difference at the time when the $SiO_2$ film thickness is 25 nm and the amount of etching is changed from 20 nm to 25 nm. As illustrated in FIG. 6A, the vibration in the wavelength direction is caused like a sinewave at a generally uniform frequency with respect to the wavenumber axis. In other words, the spectrum vibrates with amplitudes including a plurality of maximum values or minimum values to changes in the wavenumber or the wavelength.

A signal indicative of the spectrum data after data shaping is transmitted to the wavelength-direction signal processing unit 206 and is further subjected to signal processing. The wavelength-direction signal processing unit 206 detects an envelope by performing removal of high-frequency components by the LPF, Hilbert transform, or peak-bottom detection on the spectrum data in which light amount values are aligned at equal intervals along the wavenumber axis.

In the first embodiment, the LPF is performed in the wavelength direction to remove vibration components in the wavelength direction.

Here, FIG. 6B illustrates an example of a spectrum difference obtained by removing vibrations in the wavelength direction in the wavelength-direction signal processing unit 206. In the example of the spectrum difference illustrated in FIG. 6A, the vibration components have a generally constant frequency, and it is found from FIG. 6B that the vibration components are removed sufficiently by the LPF.

Here, the cut-off frequency in the LPF is set, based on a vibrational frequency in FIG. 6A, to the half of the vibrational frequency. The cut-off frequency should be equal to or less than the vibrational frequency, but when the cut-off frequency is set too low, low-frequency components are also removed as well as high-frequency components, so that the shape of the spectrum may be distorted. Accordingly, it is desirable that the cut-off frequency be set to a value that can remove the vibrational frequency.

Data subjected to signal processing in the wavelength direction is input into the postprocessing unit 208 and is subjected to smoothing of the light amount at each wavelength in the time direction, or the like. For example, as a result of independently performing signal processing on the spectrum at each time in the wavelength-direction signal processing unit 206, changes in the light amount at each wavelength between times may become discontinuous. In that case, the LPF may be performed on the light amount at each wavelength in the time direction, or a moving average may be calculated. In the present embodiment, the spectrum at each time is subjected to data smoothing by a moving average of one second before.

Processed data obtained by performing such processing is transmitted to the waveform comparator 102 and is compared with data stored in the waveform pattern database 122, so that pattern matching is performed. In the waveform pattern database 122, pieces of pattern data in which spectra of a plurality of predetermined wavelengths are associated with their corresponding amounts of etching in the metal film 302, obtained by etching the process target 16 having the film structure illustrated in FIGS. 3A and 3B in advance, are registered. In the present embodiment, data corresponding to a laminated film with an $SiO_2$ film thickness of 24 nm is used as pattern data, and pieces of pattern data corresponding to a film structure having a configuration different from a laminated film with an $SiO_2$ film thickness of 25 nm in the actual process target 16 subjected to the steps of the etching process are used.

In the meantime, the pieces of pattern data are constituted by spectra obtained by performing the same signal processing as the signal processing performed on spectra obtained from the actual process target 16 subjected to the steps of the etching process. The waveform comparator 102 compares data on a spectrum obtained at a given sampling time during the process with the spectra in the pieces of pattern data stored in the database, and the amount of etching corresponding to pattern data with the smallest difference as a result of pattern matching is detected as the amount of etching at the time.

Here, in a case where data on a spectrum obtained at a given time during the processing or spectra in time series obtained at a plurality of times during the process is not subjected to data processing in the data shaping unit 204, the wavelength-direction signal processing unit 206, or the postprocessing unit 208 illustrated in FIG. 2, spectra with the same amount of etching in the metal film 302 have different values as illustrated in FIG. 5, and even if pattern matching is performed on data on a spectrum obtained during the process by use of highly accurate pattern data obtained in advance, it is difficult to detect the amount of etching with accuracy. In the meantime, in the present embodiment, by performing signal processing in the digital signal processing unit 100 illustrated in FIG. 2, it is possible to acquire a spectrum indicating an actual amount of etching with accuracy even when the height of the whole film structure including a plurality of laminated films on the process target 16 varies.

FIG. 7 is a view illustrating a result obtained by comparing processed data subjected to the signal processing with pattern data. FIG. 7 illustrates a result of comparison of data on a spectrum detected during the plasma process on the process target 16 with a spectrum of pattern data stored in the waveform pattern database 122 in a case where the amount of etching is 25 nm. In FIG. 7, a continuous line represents data on a spectrum difference obtained during the process on the process target 16 including the oxide film 301 having an $SiO_2$ film thickness of 25 mm, with the wavelength being taken along the lateral axis, and a broken line represents data on a spectrum difference of pattern data with the oxide film 301 having an $SiO_2$ film thickness of 26 nm, the data being stored in the waveform pattern database 122. The spectrum differences both exhibit a difference from a spectrum in a case of a predetermined amount of etching. As illustrated in FIG. 7, respective distributions of the two spectrum differences agree with each other with accuracy, and hereby, matching with the pattern data stored in the waveform pattern database 122 can be performed with accuracy by use of data on the spectrum difference obtained by use of the configuration described in the present embodiment, and thus, the amount of etching can be detected.

The amount of etching detected as such is processed by the etching amount storage unit 104 and the etching amount correcting unit 106 and then input, as data indicative of the amount of etching, into the control unit 40 communicably connected to the plasma processing apparatus, and the data is stored in an internal storage device. The control unit 40 determines whether or not the amount of etching at the sampling time, indicated by the data, arrives at a target value, and when the control unit 40 determines that the amount of etching arrives at the target value, the control unit 40 sends an instruction to stop the etching process to the plasma processing apparatus, so that the etching process on the process target 16 subjected to the steps of the etching process is ended.

Operations and Effects

As described above, in the first embodiment, even in a case where the height of the whole film structure formed in advance on the surface of the process target 16 such that a plurality of film layers is laminated varies between a plurality of process targets 16, when signal processing is performed by use of light amount data on spectra obtained from the reflection light 24 from the surface of the process target 16, the amount of lateral etching in the metal film 302 as a process target is detectable with high accuracy, and the end point of the etching process on the process target 16 can be determined accurately.

Here, in the first embodiment, the film structure of the process target 16, materials of the film layers of the film structure, and factors causing variations in the height of lamination are just examples, and the first embodiment is usable to maintain the correlation between the amount of etching and a spectrum to be uniform in a case where the vibrational frequency or the amplitude of the spectrum vibrating in the wavelength direction fluctuates due to variations in a structure or materials other than a part targeted for etching. For example, the first embodiment is also applicable to fluctuations in a spectrum in a case where the materials of film layers are not uniform and a difference is caused in refractive index. Further, in the present embodiment, pattern matching using a spectrum difference is used as the determination method of determining the amount of etching, but a technique to determine the amount of etching from a spectrum is not limited to the present embodiment, and the amount of etching may be determined by use of light amount data on a specific wavelength in a spectrum or feature amount data extracted from the spectrum.

Further, the amount of etching is determined by use of a spectrum difference (the change amount in the spectrum), but the present invention is not limited to this. For example, the amount of etching can be determined by comparing data on a spectrum obtained from reflection light with a spectrum of pattern data. Further, data in which the wavelength is converted into the wavenumber in data on a spectrum obtained from reflection light is used, but the present invention is not limited to this. For example, the amount of etching can be determined based on data in which the wavelength is not converted.

Second Embodiment

In the first embodiment, the conversion of the wavelength axis and the resampling of light amount data are performed by the data shaping unit 204. Instead of performing such data processing, by using lower envelope detection in the wavelength-direction signal processing unit 206, it is also possible to detect the amount of etching with accuracy. The second embodiment describes a configuration to detect the amount of etching in such a manner. In the following description, configurations other than the difference are the same as those in the embodiment described with reference to FIGS. 1A to 7, and descriptions thereof are omitted unless otherwise required.

Figure 8A:
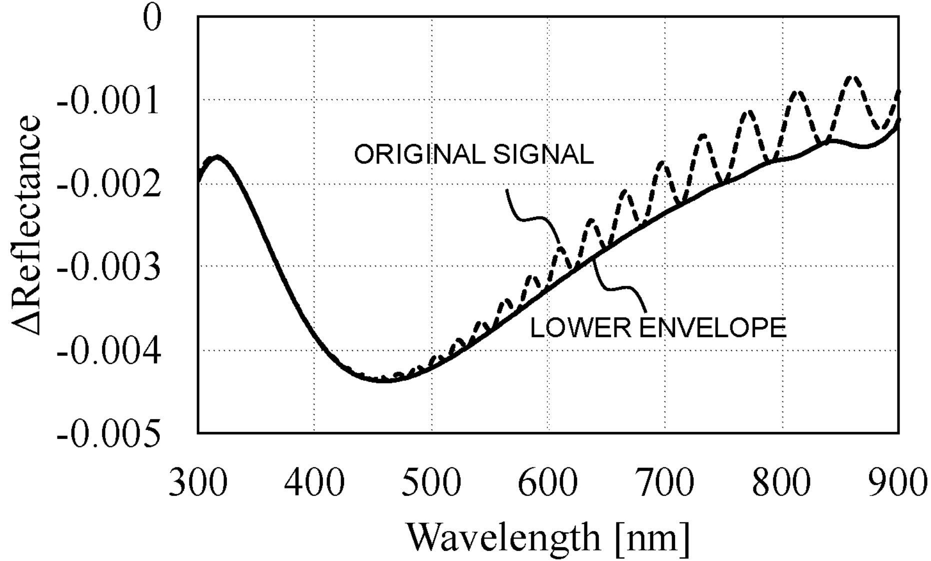
FIGS. 8A and 8B are views illustrating a case where a lower envelope is used.
Figure 8B:
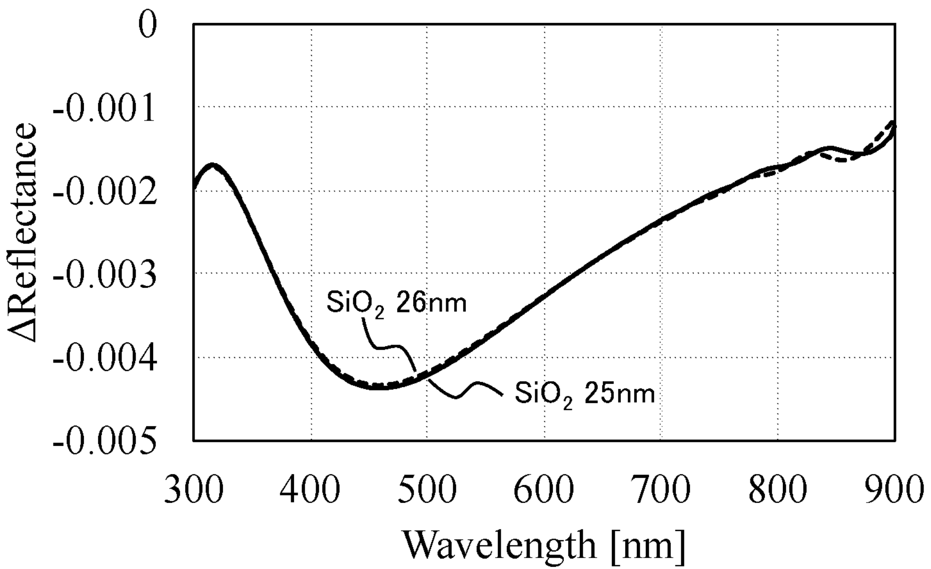

FIGS. 8A and 8B are views illustrating a case where a lower envelope is used. In FIGS. 8A, a result of detection of a lower envelope from spectrum data obtained during the process on the process target 16 including an $SiO_2$ film having a film thickness of 25 mm as the oxide film 301 illustrated in FIG. 5 is illustrated. A broken line indicative of an original signal represents a spectrum of a plurality of wavelengths detected from reflection light obtained at a given sampling time during the process on the process target 16, and a continuous line represents spectrum data detected as a lower envelope of the spectrum data indicated by the broken line. In the second embodiment, the lower envelope illustrated in FIG. 8A is detected as a line connecting minimum values (bottom parts) of the light amount (a parameter indicated by the vertical axis in the figure) in a zone of specific wavelengths and used as data on a spectrum based on which the amount of etching is detected.

In the example of FIG. 8A, the lower envelope is used as spectrum data without performing the conversion of the wavelength axis and the resampling of light amount data in the data shaping unit 204 of FIG. 2, but in a case where a spectrum is dealt with without converting the wavelength axis, vibrations in the wavelength direction appear to change in frequency, and the envelope detection may not also function well. In such a case, it is desirable to convert the spectrum into the wavenumber axis and to perform the envelope detection process.

A result of pattern matching performed by the waveform comparator 102 by use of the spectrum data of FIG. 8A is illustrated in FIG. 8B. Two pieces of spectrum data are data in a case where the amount of etching is 25 nm, a continuous line represents a spectrum difference obtained during the process on the film structure of the process target 16 including an $SiO_2$ film having a film thickness of 25 nm as the oxide film 301, and a broken line represents a spectrum difference created by use of pattern data stored in the waveform pattern database 122, the pattern data being indicative of a case where an $SiO_2$ film as the oxide film 301 has a film thickness of 26 nm. As illustrated in this figure, it is found that the pieces of spectrum data corresponding to the same amount of etching agree with each other with accuracy.

Operations and Effects

Thus, like the second embodiment, even by using the spectrum obtained by use of the lower envelope, the amount of etching can be detected with high accuracy, and end-point determination is achievable with high accuracy, similarly to the first embodiment illustrated in FIGS. 1A to 7.

Third Embodiment

The second embodiment illustrates an example using a lower envelope, but in a case where an upper envelope is detected by the wavelength-direction signal processing unit 206 and used as spectrum data for pattern matching, the amount of etching can be also detected with accuracy. The third embodiment describes a configuration to detect the amount of etching in such a manner. In the following description, configurations other than the difference are the same as the configurations in the first embodiment and the second embodiment, and descriptions thereof are omitted unless otherwise required.

Figure 9A:
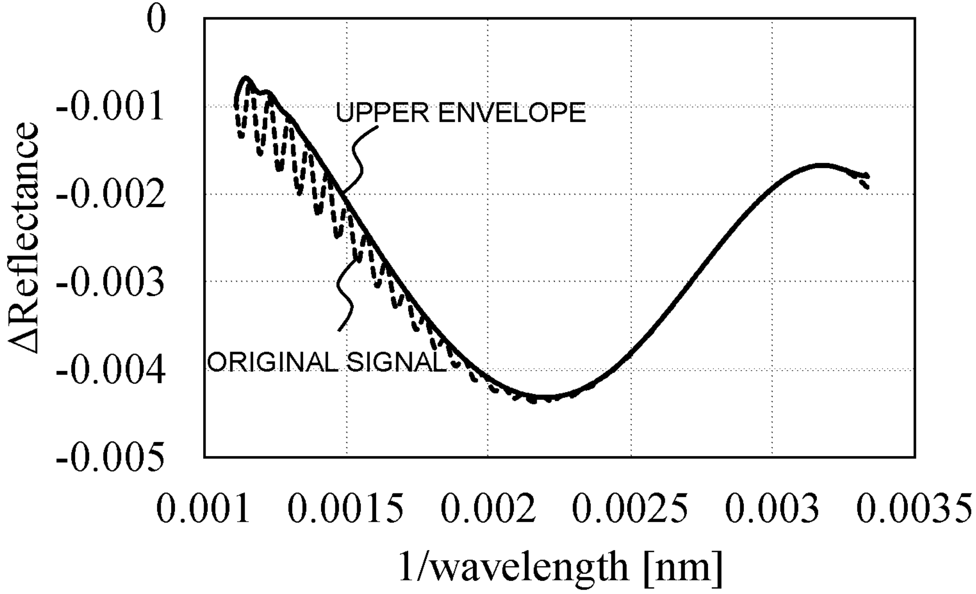
FIGS. 9A and 9B are views illustrating a case where an upper envelope is used.
Figure 9B:
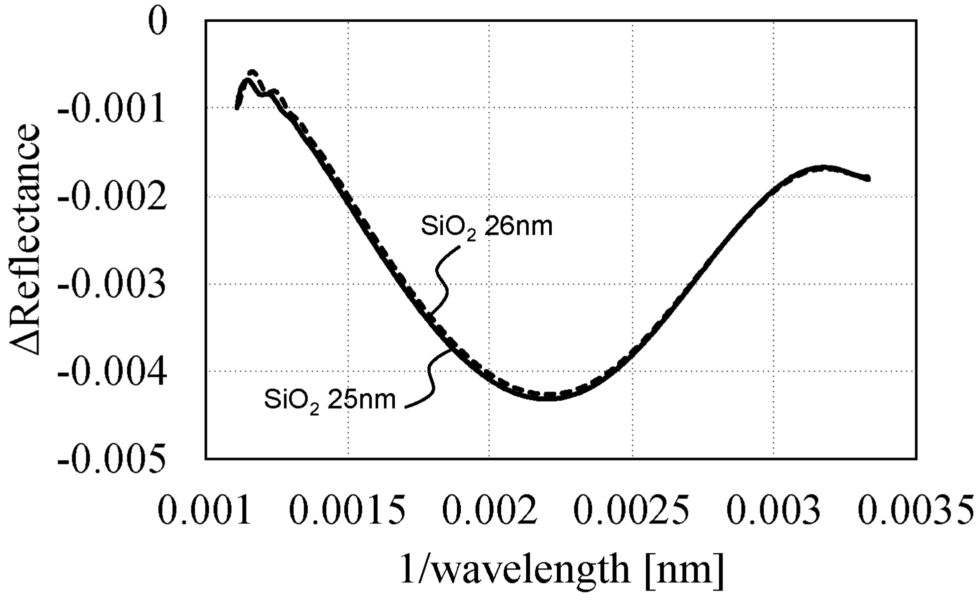

FIGS. 9A and 9B are views illustrating a case where an upper envelope is used. FIGS. 9A and 9B illustrate an example in which an upper envelope is detected from spectrum data obtained during the process on a film structure in which an $SiO_2$ film as the oxide film 301 illustrated in FIG. 6A has a film thickness of 25 mm. A broken line indicative of an original signal represents a spectrum of a plurality of wavelengths detected from reflection light obtained at a given sampling time during the process on the process target 16, and a continuous line represents spectrum data detected as an upper envelope of the spectrum data indicated by the broken line.

In the detection of an upper envelope illustrated in FIGS. 9A and 9B, the LPF, an HPF (High Pass Filter), and Hilbert transform are used. First, the LPF and the HPF having the same cut-off frequency are performed on the same spectrum data illustrated in FIG. 6A, and a result of low-pass filtering performed by use of the LPF and a result of high-pass filtering performed by use of the HPF are acquired. Low-frequency components are removed from spectrum data subjected to the high-pass filtering by the HPF, and only vibrations in the wavenumber direction are extracted.

Further, in the third embodiment, Hilbert transform is performed on the spectrum data thus subjected to the high-pass filtering, and an envelope of the vibration components is calculated as a spectrum. When the envelope spectrum thus calculated is added to a spectrum of low-frequency components obtained after the low-pass filtering, an upper envelope is detected.

The upper envelope thus acquired is taken as spectrum data to be used for detection of the amount of etching, and a result of pattern matching performed by the waveform comparator 102 with a spectrum of pattern data stored in the waveform pattern database 122 is illustrated in FIG. 9B. Two pieces of spectrum data are data in a case where the amount of etching is 25 nm, a continuous line represents a spectrum difference obtained during the process on the film structure of the process target 16 including an $SiO_2$ film having a film thickness of 25 nm as the oxide film 301, and a broken line represents a spectrum difference created by use of pattern data stored in the waveform pattern database 122, the pattern data being indicative of a case where an $SiO_2$ film as the oxide film has a film thickness of 26 nm. As illustrated in this figure, it is found that the pieces of spectrum data corresponding to the same amount of etching agree with each other with accuracy.

Operations and Effects

As described above, like the third embodiment, even by using the spectrum obtained by use of the upper envelope, the amount of etching can be detected with high accuracy, and end-point determination is achievable with high accuracy, similarly to the first embodiment illustrated in FIGS. 1A to 7.

The embodiments of the present invention have been described above, but the present invention is not limited to the above embodiments, and various modifications can be made without departing from the gist of the present invention.

For example, a lower envelope is used in the second embodiment, but an upper envelope is also usable as spectrum data based on which the amount of etching is detected, and further, an upper envelope is used in the third embodiment, but a lower envelope is also usable as spectrum data based on which the amount of etching is detected.

DESCRIPTION OF REFERENCE NUMERALS

1 plasma processing apparatus
10 vacuum process chamber
12 plasma
14 specimen support
16 process target
18 light source unit
20 introduction lens
22 irradiation light
24 reflection light
26 detection lens
28 detecting unit
30 etching amount calculating unit
40 control unit
50 optical system
100 digital signal processing unit
102 waveform comparator
104 etching amount storage unit
106 etching amount correcting unit
122 waveform pattern database
202 preprocessing unit
204 data shaping unit
206 wavelength-direction signal processing unit
208 postprocessing unit
301 oxide film
302 metal film
303 Si substrate
304 trench
305 side wall surface
D1 time series data output from the detecting unit
D2 time series data output from the digital signal processing unit
D3 etching amount data output from the waveform comparator
D4 etching amount data output from the etching amount storage unit

The invention claimed is:

1. A plasma processing method for etching in a lateral direction one of a plurality of films arranged on a wafer located in a processing chamber using plasma generated therein, the plasma processing method comprising:

a first step of irradiating light with a light source onto a surface of the wafer;

a second step of receiving light reflected from the surface of the wafer at a plurality of predetermined times during the processing of the wafer;

a third step of performing signal processing on data indicating amounts of the light with a plurality of wavelengths, the data indicating the amounts of the light including vibration components in amplitudes vibrating in a wavelength direction of the plurality of wavelengths corresponding to an increase or a decrease of wavelengths or wavenumbers with a plurality of maximum values or minimum values, and the signal processing including a step of removing the vibration components vibrating in the wavelength direction in a range of frequencies of vibration which are larger than a predetermined value;

a fourth step of determining an amount of etching for at least one of the predetermined times during the processing of the wafer by using a result of the signal processing in the third step; and a fifth step of determining an end point of the processing of the wafer based on the result of the determining of the amount of etching in the fourth step and stopping or changing a condition for the processing of the wafer.

2. The plasma processing method according to claim 1, wherein:

the signal processing includes a sixth step of converting the plurality of wavelengths into wavenumbers and performing interpolation and resampling on the light amount data such that the wavenumbers are aligned at equal intervals along an axis indicative of the plurality of wavenumbers.

3. The plasma processing method according to claim 1, wherein in the fourth step, the amount of etching in the wafer is determined based on the data obtained through the signal processing on the data indicating the amount of light during the processing of the wafer by use of pattern data obtained in advance associated with a plurality of amounts of etching.

4. The plasma processing method according to claim 1, wherein the wafer includes a multilayer film formed on the surface of the wafer, in which insulating films and target films for the processing of the wafer including metal are alternately laminated in an up-down direction; and in the fourth step, the amount of lateral etching in the target films is detected.

5. The plasma processing method according to claim 4, wherein:

the insulating films are made of a substance containing silicon oxide; and the target films each have a surface made of a substance configured to reflect light.

6. A plasma processing method for etching a wafer located in a processing chamber using a plasma generated therein, the plasma processing method comprising:

a first step of irradiating light from a light source onto a surface of the wafer;

a second step of receiving light reflected from the surface of the wafer at a plurality of predetermined times during the processing of the wafer;

a third step of performing signal processing on data indicating amounts of the light with a plurality of wavelengths, the data indicating of the amount of the light including vibration components in amplitudes vibrating in a wavelength direction of the plurality of wavelengths corresponding to an increase or a decrease of wavelengths or wavenumbers with a plurality of maximum values or minimum values, and the signal processing including a step of removing the vibration components vibrating in the wavelength direction in a range of frequencies of vibration that are larger than a predetermined value, and the signal processing includes a step of detecting a lower envelope or an upper envelope of the vibration components in the data indicating the amount of the light;

a fourth step of determining an amount of etching for at least one of the predetermined times during the processing of the wafer by using a result of the signal processing in the third step; and a fifth step of determining an end point of the processing of the wafer based on the result of the determining of the amount of etching in the forth step and stopping or changing a condition for the processing of the wafer.

7. The plasma processing method according to claim 6, wherein in the fourth step, the amount of etching in the wafer is determined based on the data obtained through the signal processing on the data indicating the amount of light during the processing of the wafer by use of pattern data obtained in advance associated with a plurality of amounts of etching.

8. The plasma processing method according to claim 6, wherein the wafer includes a multilayer film formed on the surface of the wafer, in which insulating films and target films for the processing of the wafer including metal are alternately laminated in an up-down direction; and in the fourth step, the amount of lateral etching in the target films is detected.

9. The plasma processing method according to claim 8, wherein the insulating films are made of a substance containing silicon oxide; and the target films each have a surface made of a substance configured to reflect light.

* * * * *